United States Patent [19]
Giamei et al.

[11] Patent Number: 6,046,669
[45] Date of Patent: Apr. 4, 2000

[54] FULLY TESTABLE CMOS COMPARATOR CIRCUIT WITH HALF-COMPARING STAGE

[75] Inventors: Bruce Conrad Giamei, Poughkeepsie; George Anthony Sai-Halasz, Mt. Kisco, both of N.Y.

[73] Assignee: International Business Machines Corporation, Armonk, N.Y.

[21] Appl. No.: 08/877,947

[22] Filed: Jun. 18, 1997

[51] Int. Cl.$^7$ .................................................. G06F 7/02
[52] U.S. Cl. ............................................... 340/146.2
[58] Field of Search ........................................ 340/146.2

[56] References Cited

U.S. PATENT DOCUMENTS

5,548,270   8/1996   Kim et al. ............................. 340/146.2
5,592,142   1/1997   Adams et al. ......................... 340/146.2

*Primary Examiner*—Margaret Rose Wambach

[57] ABSTRACT

A fully testable CMOS comparator circuit is disclosed having INV and NAND logic gates which form data paths for propagating data through the comparator circuit. The data propagated through the comparator circuit include greater-or-equal signals. The comparator is fully testable because there are no redundant circuit elements.

14 Claims, 10 Drawing Sheets

FIG. 1   NANDs MERGE UNIT (N_MERGE)

FIG. 2   TWO BIT GREATER-OR-EQUAL GENERATOR (TWB GE)

FIG. 3  4-BIT GE $A = \bar{B}h + AhAl$

FIG. 5  MERGE_HF

*FIG. 4*

TWO BIT "HALF" GREATER-OR-EQUAL GENERATOR (TWB_HF)

FIG. 6

FIG. 7   4-BIT A_GE_B

$A = AhAl$
$B = \overline{A}h + BhBl$

FIG. 8   INVg MERGE UNIT (M_INVg)

$A = Ah(\overline{B}h + \overline{B}l + AlA\_)$

FIG. 9

Testable, non-redundant 4-BIT A_GE_B

$A = \bar{B}h + AhAl$
$B = BhBl$

FIG. 12

FIG. 13a   M_INVg

FIG. 13b   M_INVs

FIG. 14   TAP_OFF

FIG. 15

$$A = Ah(\bar{B}hm + \bar{B}l + AlmA\_)$$
$$Bm = Bm\_(\bar{A}h + BhmBl)$$

FIG. 16

$$Am = Am\_(\bar{B}h + AhmAl)$$
$$B = Bh(\bar{A}hm + \bar{A}l + BlmB\_)$$

FULLY TESTABLE CMOS COMPARATOR CIRCUIT WITH HALF-COMPARING STAGE

BACKGROUND OF THE INVENTION

1. Field of the Invention

The present invention relates generally to digital circuits and specifically to a comparator circuit.

2. Background of the Prior Art

Greater/smaller or equal comparisons between n-bits of two data strings or input vectors are a staple operation of processors. A comparator performs these comparison operations on the primary bits of the two data or input vectors and generates some form of information depending on the values of the vectors. This information is then passed along to merging stages. These stages take the information from pairs of bits, merge it again into the same information and pass it along. The next level of merge units receive the information on pairs of pairs and merge that again. At each stage, the information at the output of a merge unit relates to two times the bits of the one earlier stage.

In most prior art comparators in processors, the vectors are inputted to AND gates and the outputs of the AND gates are inputted to a NOR logic gate which merges the information. The AND gates pass along information in the form of the following two signals: if the two vectors up to that point are equal; or if one is greater than the other. The NOR logic gate generates a >= signal. For instance, an output signal is high if n-bit vector A is greater or equal to n-bit vector B. Further, in the classical case a comparator requires an additional logic stage having an INV gate. Therefore, in the classical comparator the merge units are actually three simple logic stages NAND-INV-NOR or NOR-INV-NAND. A NOR circuit includes stacked-p transistors which are inherently slower than non-stacked-p devices. Still further, the classical comparator, with its = and > tree structure is inherently redundant and not fully testable. Generally, the process of generating and carrying forward A=B A>B signals involves more circuitry and is slower in speed as compared to generating and carrying A>=B and B>=A signals.

SUMMARY OF THE INVENTION

The disclosed AND-NAND comparator circuit is a binary tree like all prior art comparator circuits, but it is fundamentally different from the prior art circuits in the way it passes information along the tree. In the comparator of the present invention the signal passed down the tree is: A greater or equal to B; or B greater or equal to A. The A>=B or the B>=A is the signal that the unit has to output. A NOR decoding circuit (having stacked-p transistors) is not used.

The novel method of propagating information along the tree leads to circuit implementations which are simpler and faster than existing ones. However, what makes the circuitry of the present invention even faster is the speed of the merging stages. They are all composed of NANDs and there are fewer logic stages in the tree.

The present invention provides a comparator for performing at least one greater or equal comparison between N-bits of a first binary number, A, and a second binary number, B, and providing one final output based on the comparison. The comparator comprises a comparing circuit for comparing two bit pairs, one bit pair from the first binary number and another bit pair from the second binary number. The comparing circuit having at least two outputs, one of the outputs having a true state representing that the bit pair of the first binary number is greater than or equal to the bit pair of the second binary number, and second of the outputs having the true state representing that the bit pair of the second binary number is greater than or equal to the bit pair of the first binary number. A half-comparing circuit for comparing the least significant bits of the first binary number with the least significant bits of the second binary number and outputting a true state if the least significant bits of the first binary number is greater than or equal to the bit pair of the second binary number. A merging circuit for merging two input bit pairs into one merged bit pair, each bit in said two input bit pairs having the true state representing greater than or equal, one of the two pairs representing higher order bits than the other of the two input bit pairs. A half-merging circuit for merging an input pair and a single bit into one merged bit pair, each bit in the input bit pair and the single bit having the true state representing greater than or equal, the bit pair representing higher order bits than the single bit.

Many other objects and purposes of the invention will be clear from the following detailed description of the drawings.

BRIEF DESCRIPTION OF THE DRAWINGS

An embodiment of the invention will now be described, by way of example, with reference being made to accompanying drawings in which.

DETAILED DESCRIPTION OF THE PREFERRED EMBODIMENTS

The operation principle and examples of the fully testable CMOS comparator circuit according to the present invention is described hereinbelow with reference to FIGS. 1–18. According to an illustrative embodiment of the present invention, an AND-NAND comparator circuit performs n-bit >= or <= comparisons on A(n) and B(n) vectors. The circuit is simpler and faster than existing implementations and it is fully testable which the prior art comparators are not.

All further discussions are in terms of an A_GE_B output (A vector is greater than or equal to B vector). However, it must be understood that this is not a constraining condition. The AND-NAND comparator is general in terms of relations. One can ask for A<=B, A<B, or A>B. In fact, the A>=B output is at the same time an B<=A output, and its negation is A<B. Furthermore, the A>=B operation mathematically is equivalent to calculating the carry bit of the A–B subtraction in 2's complement arithmetic. The AND-NAND comparator can accordingly be used to calculate such a carry bit.

The description of the CMOS comparator circuit of the present invention is done in two steps. First, a CMOS comparator is described which has only one kind of merge unit containing only two-way NAND circuits. This NANDs comparator passes the information along the tree according A_GE_B, but contains redundant circuit elements. In the second step, the final fully testable CMOS AND-NAND comparator circuit is described. Its operation is more easily understood when it is given in the context of the descriptions of NANDs comparator of the first section.

In the comparator of the present invention both output signals cannot be simultaneously in the low state, if the greater or equal (GE) state is coded as high. The four "correct" inputs into a basic NANDs merge unit are the following:

Ah is 1 if the high bit of A is greater-or-equal to the high bit of B;

Al is 1 if the low bit of A is greater-or-equal to the low bit of B;

Bh is 1 if the high bit of B is greater-or-equal to the high bit of A; and

Bl is 1 if the low bit of B is greater-or-equal to the low bit of A.

The two outputs from the basic merge unit mean the following: A is 1 if the Ah–Al combination of bits is greater-or-equal to the Bh–Bl combination (If Ah is 0, A will be 0); B is 1 if the Bh–Bl combination of bits is greater-or-equal to the Ah–Al combination (If Bh is 0, A will be 0). If Ah(Bh) and Al(Bl) referred to m-bits, A and B will refer to 2m-bits, and so on, until the tree is completed. The final A and B output contains the information relating to the whole N-bit vectors.

Section 1. The NANDs Comparator

Figure 1:
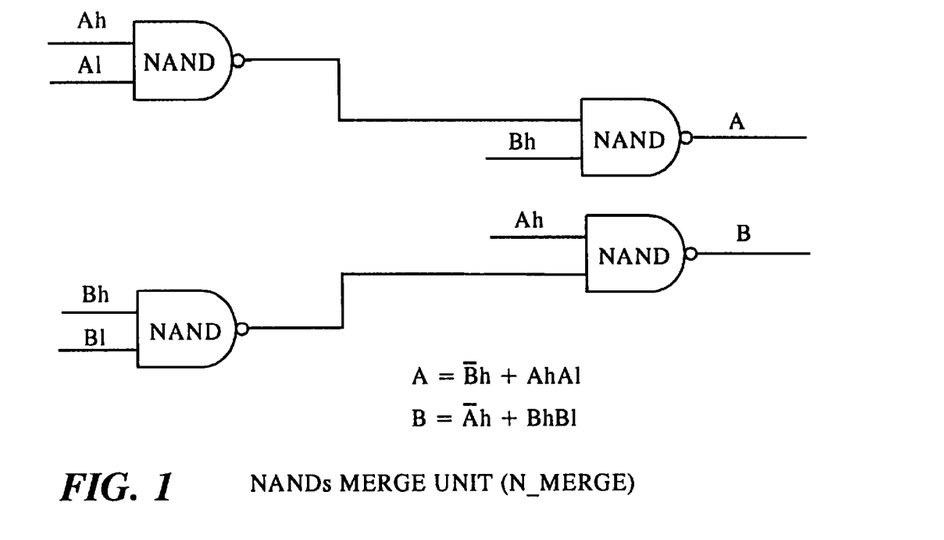
FIG. 1 is a schematic illustration of a NANDs merge unit.
Figure 2:
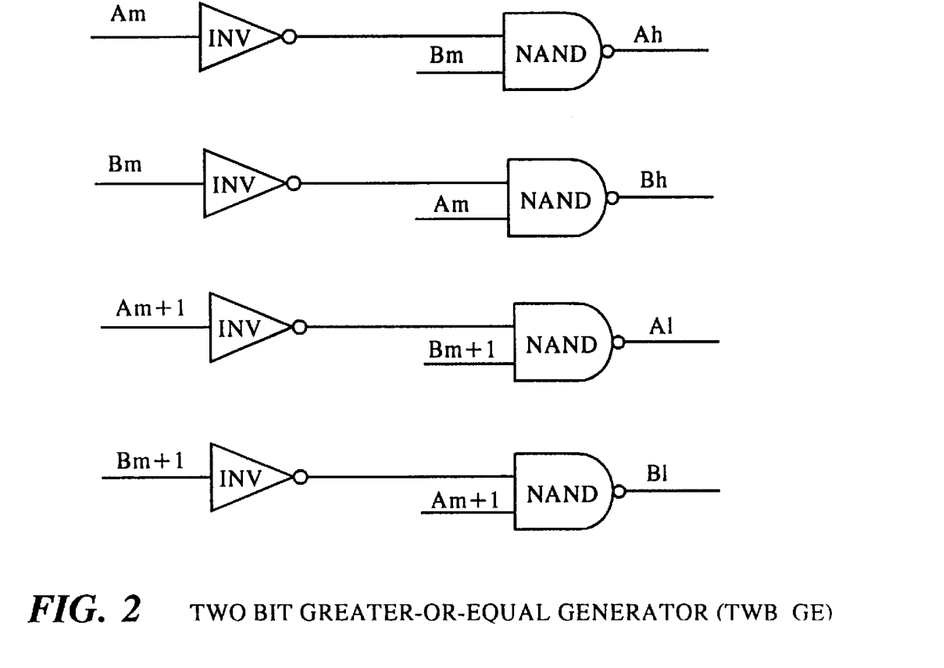
FIG. 2 is a schematic illustration of a two-bit greater-or-equal generator.

The needed merge units are realized with four two-way-NAND gates shown by FIG. 1. In FIG. 1, A=$\overline{Bh}$+AhAl and B=$\overline{Ah}$ =BhBl. The incoming bits are compared in pairs. The first Ah, Bh, Al, and Bl signals are generated by the NAND and INV combinations shown by FIG. 2.

Figure 3:
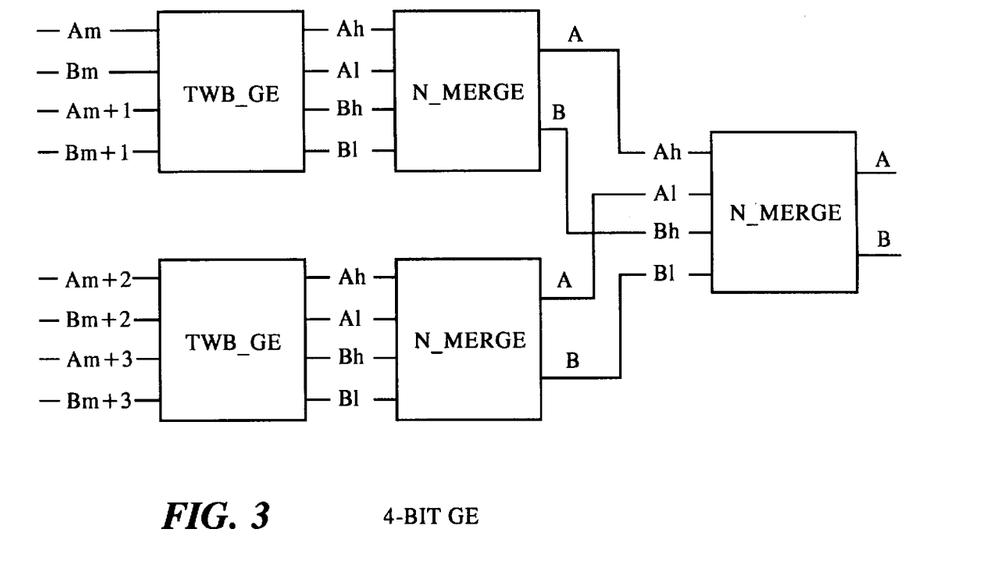
FIG. 3 is a schematic illustration of a four-bit greater-or-equal generator.

FIG. 3 depicts a four-bit (from digit m to m+3) slice of an N-bit binary tree comparator. It is fully symmetric. The same two-bit greater-or-equal generator (TWB_GE) and NANDs merge (N_MERGE) units repeat everywhere in obvious fashion. After a TWB_GE feeds an N_MERGE unit, the outputs of N_MERGE feed the input of the next stage N_MERGE. The unit containing information from the higher order bits enters the Ah and Bh inputs and reversely for the low order bits. Each subsequent A and B output contains information on the relation of two times as many bits as the ones belonging to the previous stage.

Figure 4:
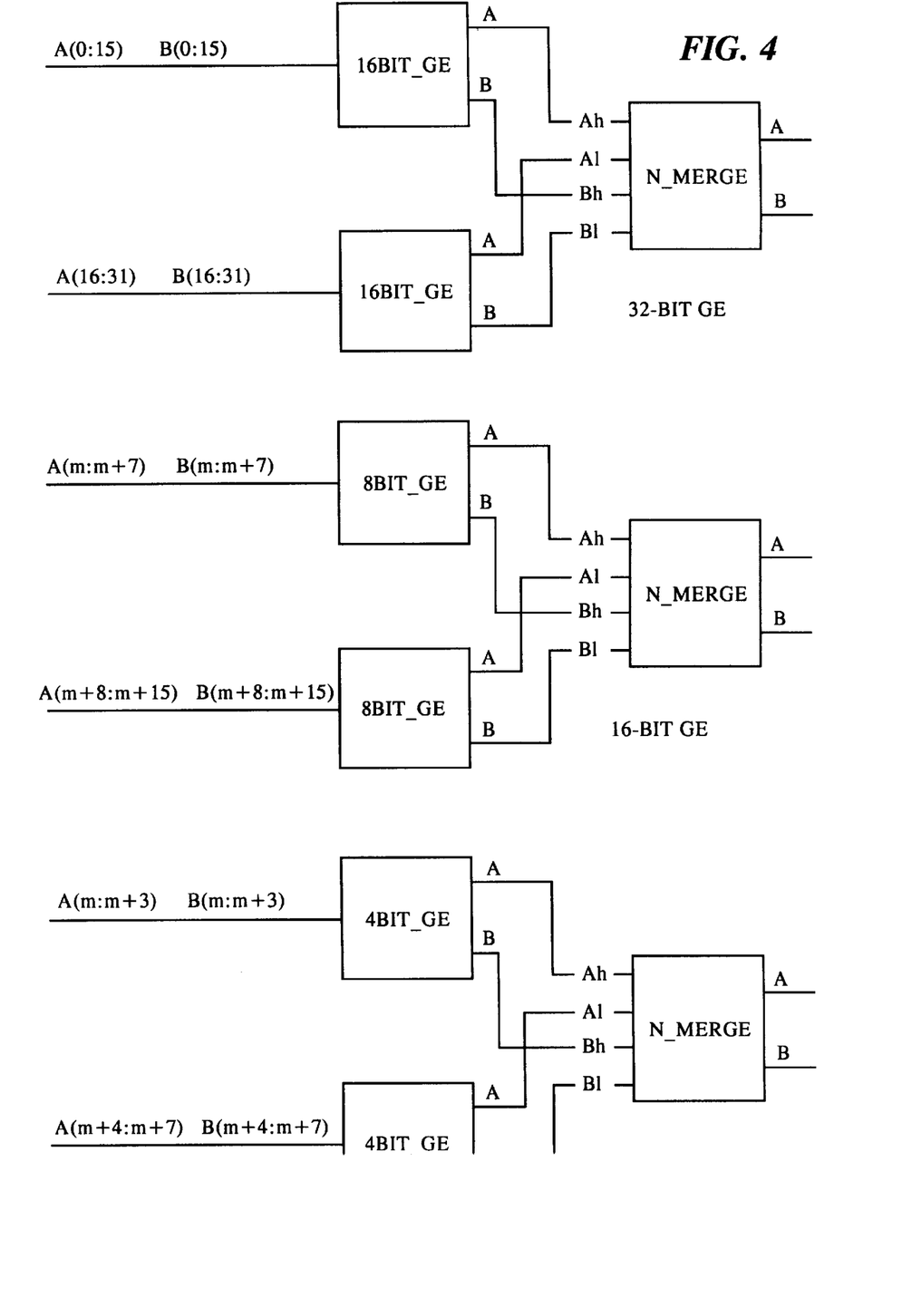
FIG. 4 is a schematic illustration of the building blocks of a 32-bit greater-or-equal generator based on NANDs merge units.

In FIG. 3, the final A and B outputs mean: A is high if A(m:m+3)>=B(m:m+3) and B is high if B(m:m+3)>=A(m:m+3). If A and B are both high, it means that A=B. An illustrative 32 bit >= comparator based on N_MERGE units is shown by FIG. 4.

Section 2. The AND-NAND Comparator

Figure 5:
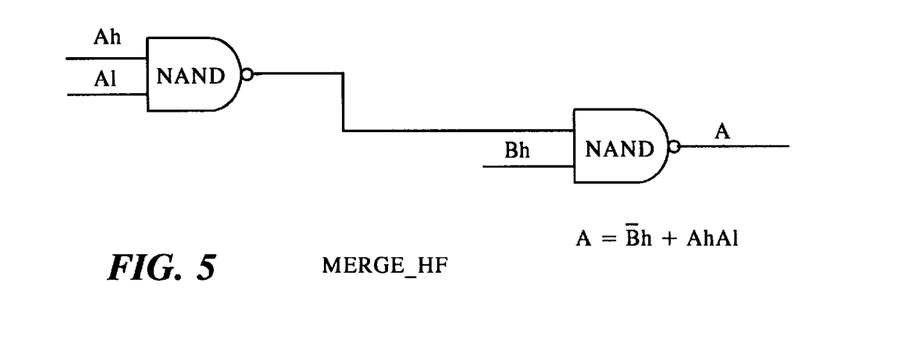
FIG. 5 is a schematic illustration of a half-a-merge unit.
Figure 6:
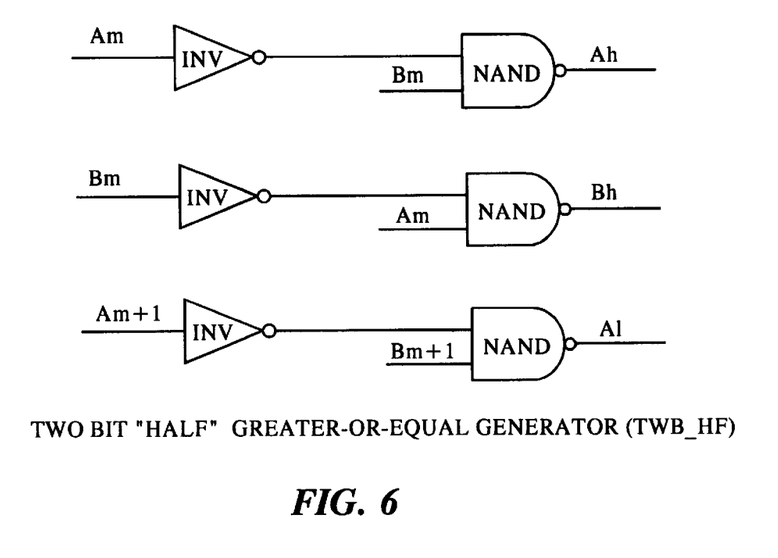
FIG. 6 is a schematic illustration of a two-bit "half" greater-or-equal generator.

As can be seen from the above description of the NANDs, one readily skilled in the art recognizes that both the A and B outputs are not needed. The A output, i.e., the A>=B output, is the only one needed. In the output N_MERGE unit, the part generating the B output can be discarded. Therefore, the output unit may be only half-a-merge (MERGE_HF) as shown by FIG. 5, where A=$\overline{Bh}$+AhAl.

If the output unit does not need the Bl input, it need not be generated. Accordingly, the unit feeding the output unit from the low-bit side may also be a MERGE_HF. Looking backwards to the tree, all the merge units leading from the least significant bit to the output may be MERGE_HF. Furthermore, since MERGE_HF needs only three inputs, the TWB_GE unit dealing with the two least significant bits of A and B does not need the Bl output (see FIG. 6). Therefore, the four-bit greater-or-equal (4-BIT A_GE_B) generator resembles the one shown by FIG. 7.

Figure 7:
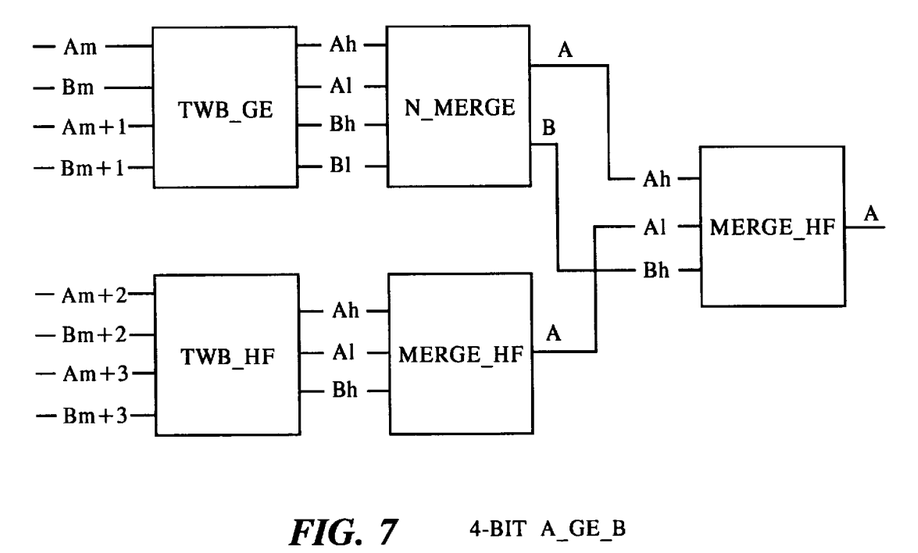
FIG. 7 is a schematic illustration of a four-bit greater-or-equal generator having half-a-merge units.
Figure 8:
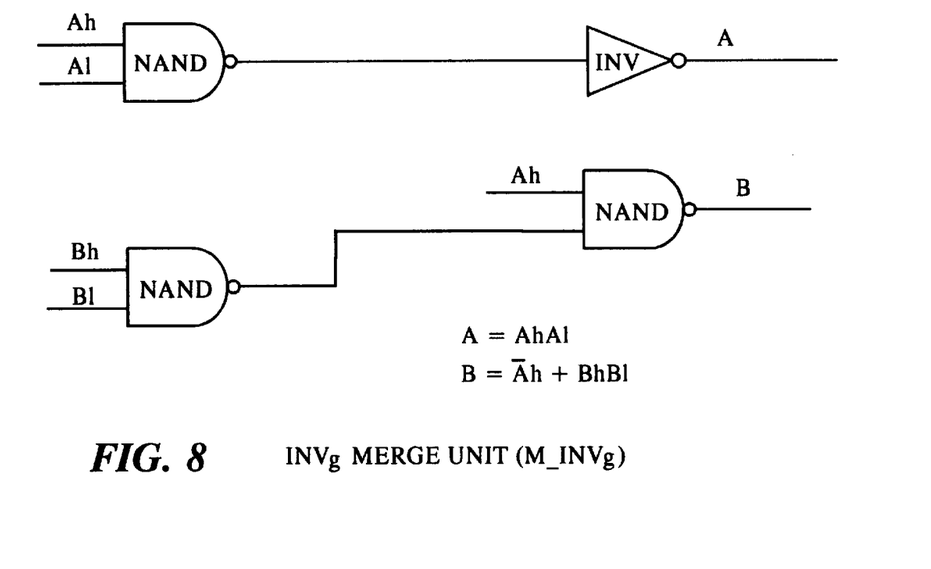
FIG. 8 is a schematic illustration of an INVg merge unit.

The comparator is not a symmetric binary tree. Each MERGE_HF cell's output is a A_GE_B signal referring to 2**k bits, where k is the count of the MERGE_HF units from the lowest order inputs toward the output. In FIG. 7 the first MERGE_HF output is a two-bit A_GE_B signal and the next is the final four-bit A_GE_B signal. If one needed an eight-bit comparator, the above four-bit one would form the bottom half. It would be feeding its output into the next MERGE_HF unit's low bit input, which with the two high bit inputs derived from the top half of the tree would output the eight-bit A_GE_B signal.

The NANDs comparator can still be simplified to obtain the final version. Since half the original output, i.e., the B_GE_A signal, is thrown away too much information is generated inside the tree. The circuit also, has redundancies, which besides slowing down operation can mask untestable, so called redundant, hardware errors.

The solution to the redundancy problem is the recognition that the exact information is only needed at the output, and not for every branch and at every stage of the tree. The information that was needed to generate the correct B output is useless. Following back from the output generating MERGE_HF unit, the unneeded circuit pieces are discarded.

Figure 9:
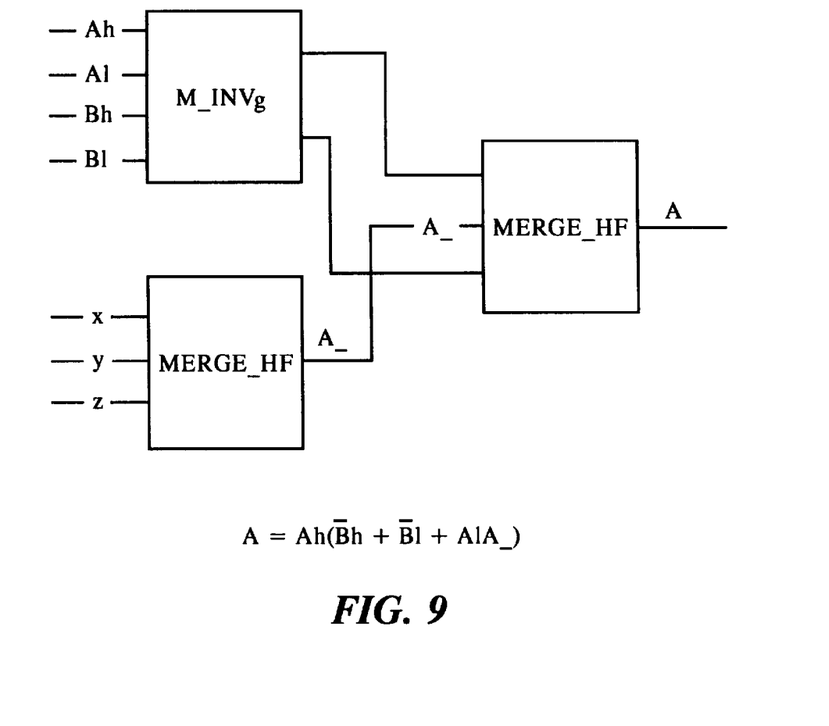
FIG. 9 is a schematic illustration of an INVg merge unit replacing a NANDs merge unit in front of a half-a-merge unit.

If the Bh input into the last MERGE_HF unit is low then the values of the Ah and Al inputs is immaterial. Accordingly, in the N_MERGE unit the NAND can be replaced with an inverter to create an INVg merge unit (M_INVg) shown by FIG. 8, where A=AhAl and B=$\overline{Ah}$+BhBl. The NAND-INV combination is a AND operation. Hence the AND-NAND comparator name. Example of an M_INVg unit replacing an N_MERGE in front of a MERGE_HF is shown by FIG. 9, where A=Ah($\overline{Bh}$+$\overline{Bl}$+AlA_). The A output is identical with the N_MERGE case for the allowed input combinations. It is also correct for some combinations which, as described below, are allowed for the AND-NAND comparator, but were forbidden in the NANDs version.

Figure 10:
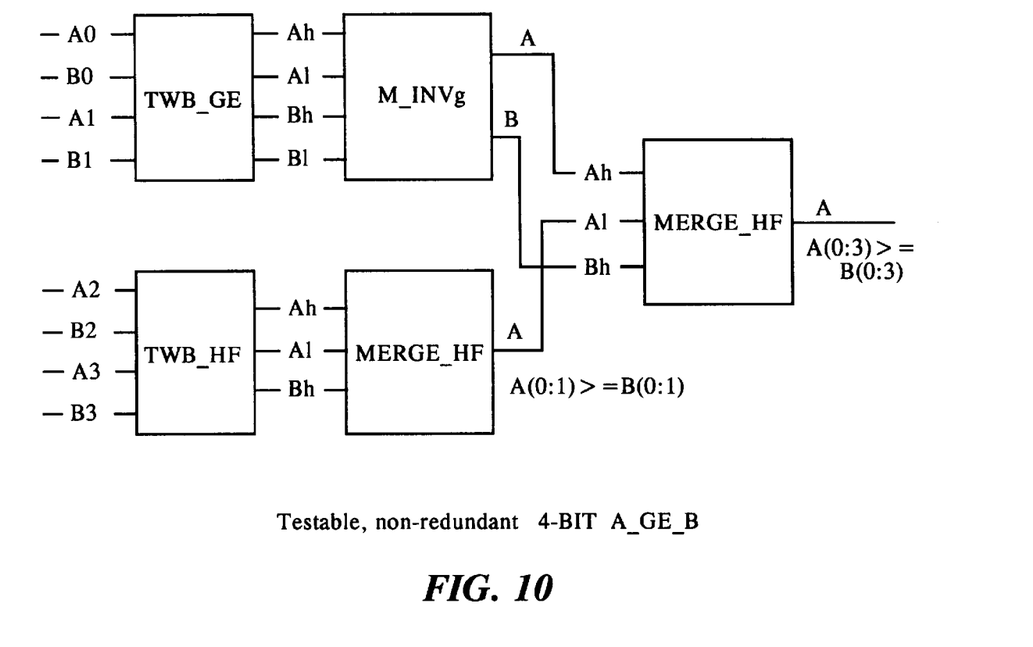
FIG. 10 is a schematic illustration of a non-redundant four-bit greater-or-equal generator.

The final, containing no redundancies, or untestable faults, four-bit greater-or-equal AND-NAND comparator is shown by FIG. 10. For the general case, for comparators of an arbitrary number of bits, it is useful to visualize in the backward (output) direction to see what redundancies are present and what symmetries can be gleaned. It is clear that for any comparator the last two logic stages will look just like the four-bit one shown by FIG. 11.

Figure 11:
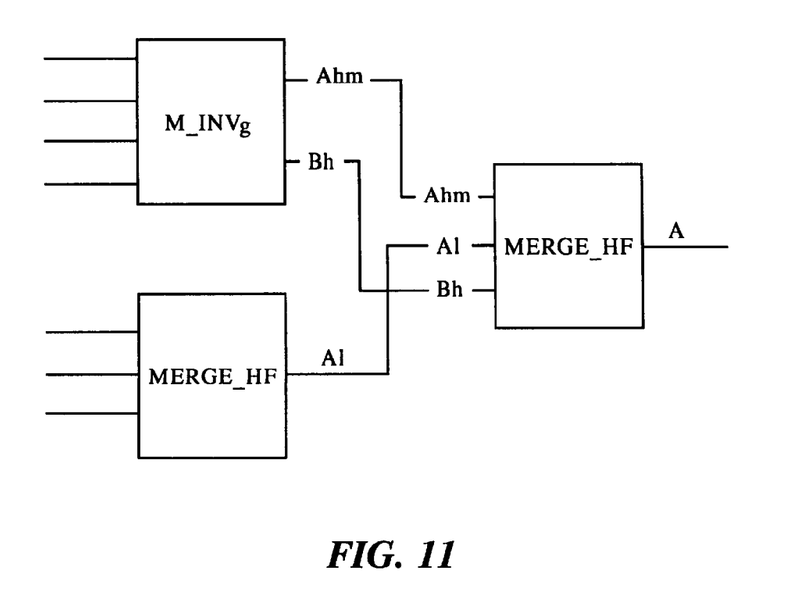
FIG. 11 is a schematic illustration of the last two logic stages of a comparator according to the present invention.

The difference compared to the four-bit one is that the inputs to the merge units must contain the information on groups of bits. The Al input into a MERGE_HF unit usually comes from the one earlier MERGE_HF unit, which has the information on the lower bits part of the tree.

Figure 12:
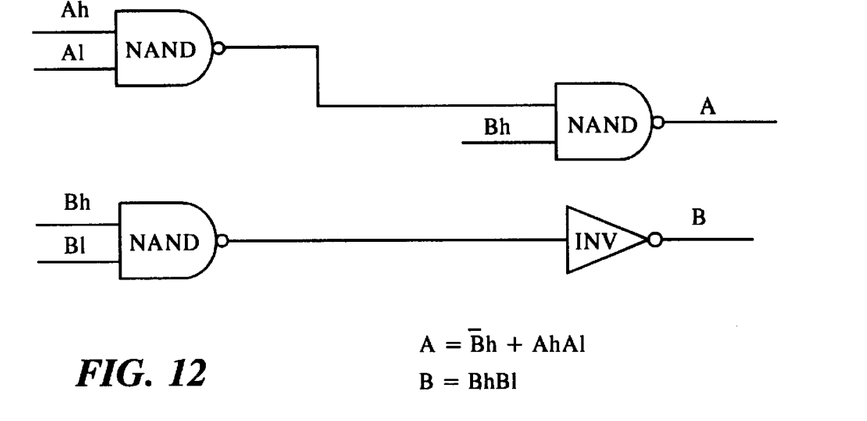
FIG. 12 is a schematic illustration of an INVs merge unit.

The question remaining is whether there are any additional redundancies if the N_MERGE units are used to feed the final two stages? A careful analysis shows that all of the N_MERGE units can be replaced with simpler cells. The final result is as follows. Two type of units do the merging without containing redundant circuits. One is the above M_INVg unit. The other, a very similar one, where again one NAND is replaced in the simpler cells with an inverter. An N_MERGE unit with an inverter, but in a mirror position compared to M_INVg results. This will be called an INVs merge unit (M_INVs), and is shown by FIG. 12, where A=Bh+AhAl and B=BhBl. The truth tables for M_INVg and M_INVs are shown by Table I.

TABLE I

| Ah | Al | Bh | Bl | A | B | |
|---|---|---|---|---|---|---|
| M_INVg: | | | | | | |
| 1 | 1 | 1 | 1 | 1 | 1 | C |
| 1 | 1 | 1 | 0 | 1 | 0 | C |
| 1 | 0 | 1 | 1 | 0 | 1 | C |
| 0 | 1 | 1 | 1 | 0 | c | |
| 0 | 1 | 1 | 0 | 0 | 1 | C |
| 0 | 0 | 1 | 1 | 0 | 1 | |
| 1 | 1 | 0 | 1 | 1 | 0 | |
| 1 | 1 | 0 | 0 | 1 | 0 | C |
| 1 | 0 | 0 | 1 | 0 | 0 | |
| M_INVs: | | | | | | |
| 1 | 1 | 1 | 1 | 1 | 1 | C |
| 1 | 1 | 1 | 0 | 1 | 0 | C |
| 1 | 0 | 1 | 1 | 0 | 1 | C |
| 0 | 1 | 1 | 1 | 0 | 1 | C |
| 0 | 1 | 1 | 0 | 0 | 0 | |
| 0 | 0 | 1 | 1 | 0 | 1 | C |
| 1 | 1 | 0 | 1 | 1 | 0 | C |
| 1 | 1 | 0 | 0 | 1 | 0 | C |
| 1 | 0 | 0 | 1 | 1 | C | |

For each, the output marked "I!" is incorrect as compared to the N_MERGE unit, and has the A=B=0 "forbidden" property. However, a proper order of merges corrects these states and provides the correct output. If the incorrect information on an output can be corrected at a succeeding stage, then there is no reason to waste circuits in order to compute the correct information at every stage. The avoidance of calculations to give explicitly correct information at every stage is precisely what makes the comparator of the present invention free of redundancies.

Basic properties and rules of M_INVg and M_INVs follow. The word "correct" means the state of an input/output as it would be if all the M_INV units were replaced with the N_MERGE units. Bh has to be correct upon entering M_INVs and Ah has to be correct upon entering M_INVg. A is always correct out of M_INVs and B is always correct out of M_INVg. The "1" state is correct everywhere, only the "0" state can be incorrect.

Figure 13A:
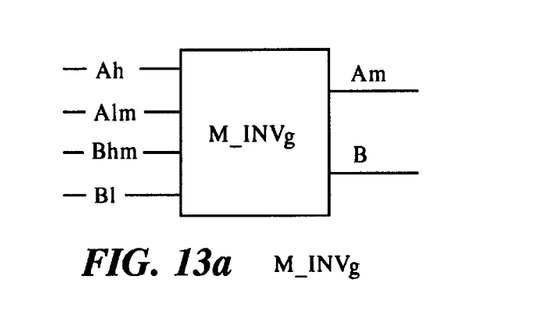
FIGS. 13a and 13b are schematic illustrations of INVg and INVs merge units having "maybe" inputs and outputs.
Figure 13B:
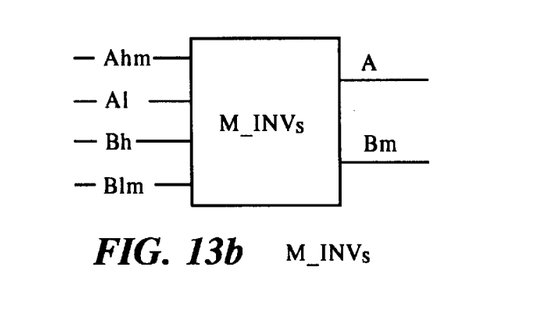
Figure 14:
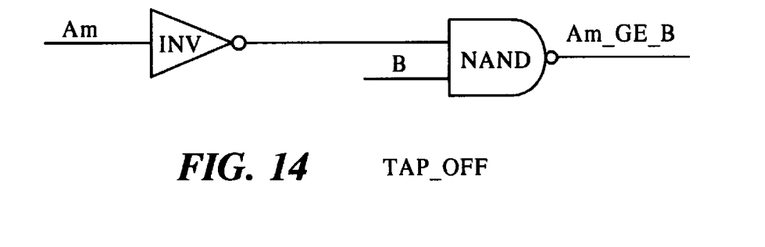
FIG. 14 is a schematic illustration of a TAP_OFF unit.

Assuming that at the root of a chain containing M_INV units all four inputs were correct, then if the always correct output is 1 the "maybe" is also correct. Only if the always correct output is 0, can the "maybe" be incorrectly also 0. Accordingly, the only existing incorrect state is the "non-possible" 0-0 state. Accordingly, the inputs and outputs of the units are relabeled to reflect which inputs and outputs can be incorrect. These inputs and outputs have an "m" attached as shown by FIG. 13.

Figure 15:
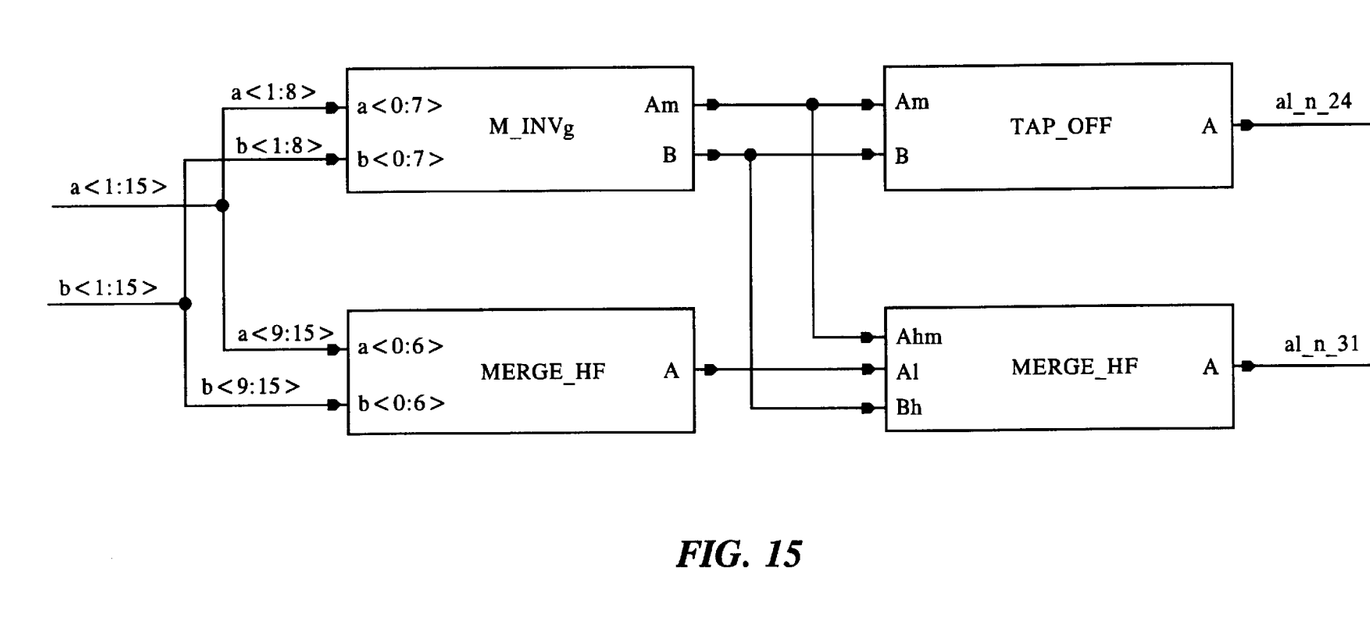
FIG. 15 is a schematic illustration of a portion of a simultaneous 24- and 31-bit comparator having a TAP_OFF unit.
Figure 16:
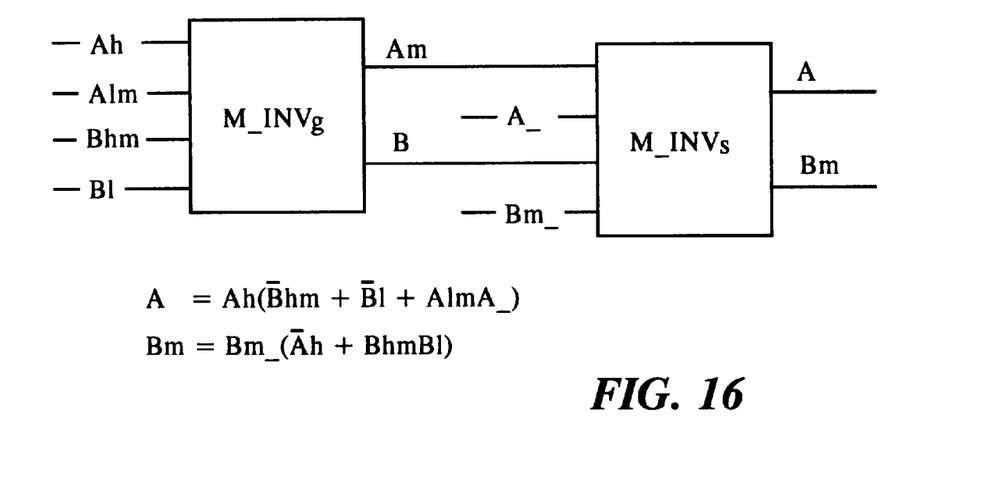
FIG. 16 is a schematic illustration of a M_INVg-M_INVs combination.
Figure 17:
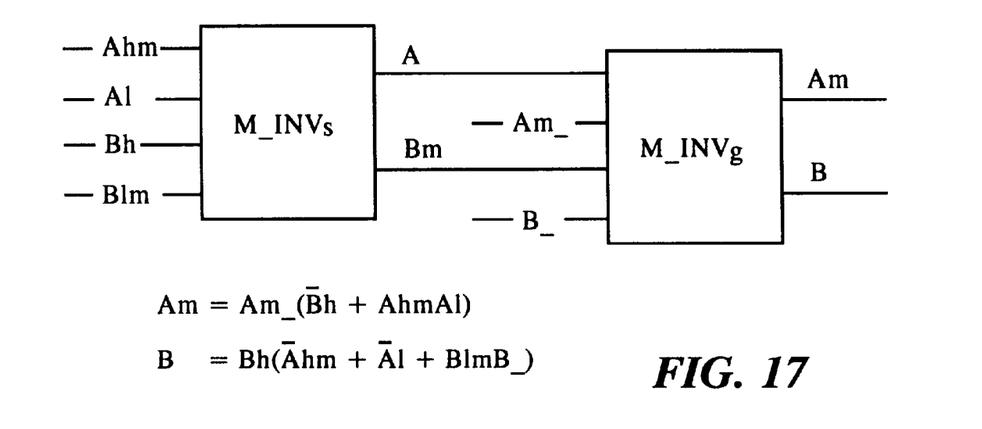
FIG. 17 is a schematic illustration of a M_INVs-M_INVg combination.

The rules of putting together a comparator in accordance with the present invention from the presented units is presented below in order to discuss its operation. The rules to put together an A_GE_B (i.e., a high state final output if A vector is greater or equal to B vector) are as follows:

1. The output is from a MERGE_HF unit.
2. The Al input of the MERGE_HF comes from another MERGE_HF, or a very similar to it, see rule No. 8 below.
3. The Ahm and Bh inputs of the MERGE_HF come from an M_INVg unit.
4. The "h" inputs (that is the information from the high bits side) of both the M_INVg and M_INVs units come from the opposite kind of unit. In more detail, the "h" inputs of M_INVg come from the outputs of M_INVs, and "h" inputs of M_INVs come from the outputs of M_INVg.
5. The "l" inputs (that is the information from the low bits side) of both the M_INVg and M_INVs units come from the same kind of unit. In more detail, the "l" inputs of M_INVg come from the outputs of M_INVg, and "l" inputs of M_INVs come from the outputs of M_INVs.
6. The MERGE_HF unit nearest to the root receives its input from TWB_HF.
7. The M_INVg or M_INVs units nearest to the root receive their inputs from TWB_GE. If the A and B vectors happen not to be a power of two it does not matter. A merging stage simply can be omitted and half of a TWB_GE unit supplies the inputs to the next level of merging. The TWB_GE unit artificially groups two one-bit greater-or-equal (OB_GE) units into one. Half a TWB_GE unit gives the Ai>=Bi and Bi>=Ai signals. As the need arises to deal with the right number of bits, the TWB_GE or OB_GE can enter either the M_INVg or the M_INVs units at either the "h" or the "l" inputs, anywhere in the tree.
8. There are cases when different numbers of bits of the same vector have to be compared simultaneously. For instance we need both the information: A(0:X)>=B(0:X) and A(0:Y)>=B(0:Y). Depending on the value of X and Y it can happen that we can only tap off for the right number of bits in a way that the Al input of the output MERGE_HF unit has to be fed directly from a M_INVg unit and not from another MERGE_HF. In this case one combines the two outputs of the M_INVg unit into one, with the help of a TAP_OFF unit shown by FIG. 14. This then feeds the Al input of the MERGE_HF. This TAP_OFF basically functions as a MERGE_HF without the Al input. It is simply half an OB_GE. An example is shown by FIG. 15 of a portion of a simultaneous 24- and 31-bit comparator where a TAP_OFF unit is used.

With the help of the labels used on the various building blocks the right pattern can be put together "blindly". The "rule" to be followed is that an "m" labeled output enters an "m" labeled input, and the all correct outputs of the TWB_GE, OB_GE, and TWB_HF units can be inserted anywhere. (Of course, the "h" outputs should enter "h" inputs and the same for the "l" inputs and outputs.) As for operation, the key is in understanding how the M_INVg and M_INVs units relate to themselves and to each other. The M_INVg-M_INVs combination has the following transfer function taken from FIG. 16: $A=Ah(\overline{Bhm}+\overline{Bl}+AlmA\_)$ and $Bm=Bm\_(\overline{Ah}+BhmBl)$.

It is apparent that by going over all allowed combinations of the inputs that the "A" output is always correct, and Bm is correct when A ends up in a high state. If one inverts A and B, the same picture emerges for the M_INVs-M_INVg combination shown by FIG. 17, where Am=Am__(
$\overline{Bh}$+AhmAl) and B=Bh($\overline{Ahm}$+$\overline{Al}$+BlmB__). Here B is always correct. Accordingly, in an alternating chain of M__INV-s, with the outputs of one unit feeding the "h" inputs of the following one, the output of each unit, either A or B, is certain to be correct. Since the MERGE__HF unit needs a correct B input the M__INVg is the one needed to feed a MERGE__HF one. The beginning of the chain can be occupied by either the M__INVg or the M__INVs unit.

For both M__INV units the "l" inputs reappear directly on the output if the both "h" input are high. In this case the information of the "l" inputs potentially can become the "h" inputs of the next unit. If either of the "h"-s is low the information of the "l" inputs disappears. This means that the information of the "l" bits has to be preserved until they have the possibility to be promoted into the "h" category. Since both M__INV units pass through the "l" bits if the "h" inputs are high, one has only to be careful which of the two low bits is certain to be correct. Thus, the outputs have to be matched with the following unit's "l" inputs. Hence, the rule that the "l" inputs of a M__INV unit are fed from the same type of unit, a "g" feeds a "g" and an "s" feeds an "s".

The comparator has no functional blocks that fully repeat. That is, lets say, an eight-bit comparator is not simply the combination of two four-bit ones. But there is a sort of pseudo repetition rule. It is easiest to give it in a recursive fashion. For a four-bit comparator, two two-bit sides feed into the MERGE__HF unit. The Al input is supplied by the two-low-bit side, whose output itself is a two-bit A__GE__B signal, and the Ahm and Bh signals come from the two-high-bit side.

The circuit for the lower-one-bit of the higher-two part is a replica of the higher bit of the two-lower ones. This pattern persists. In an eight-bit comparator the lower-two of the high-four are the same as the higher-two of the low-four. The higher-two of the high-four have no exactly matching circuits elsewhere. And so on, for instance in a 64-bit one the low-16-bits of the high-32 use the same circuits as the high-16 ones of the low-32 bits, and again, the high-16 of the high-32 have no exact match.

The comparator disclosed herein has no redundant circuits, hence there is no danger of untestable faults. It does not use any information that under the proper conditions cannot find its way to the output. Therefore, the comparator is fully testable because all testable signals are able to propagate through the comparator circuitry to output terminals for evaluation and a determination of the propagation time.

The number of simple logic stages (S) in an N-bit comparator are: 2+2*ceil(2log(n)), where "ceil(x)" means the smallest integer greater or equal to x. For instance, a 15- or 16-bit comparator takes 10 stages, while a 17-, 31-, or 32-bit one takes 12 simple stages. The longest of the paths having S stages consist of one inverter and S-1 two-way NANDs. Of the NANDs, counting from the root of the binary tree, the odd numbered ones fan out into two and the even ones fan out into one. Thus, the average fan out in the critical path is roughly 1.5. Comparing the AND-NAND with the untestable NANDs version containing only NANDs and no INV, we can see that the critical path has not changed. But since the final version has replaced 25% of the NANDs in the merge stages with inverters, most of the path did speed up. This means that one can concentrate more resources, like power in the form of device widths, on the NANDs contained in the critical paths.

Figure 18:
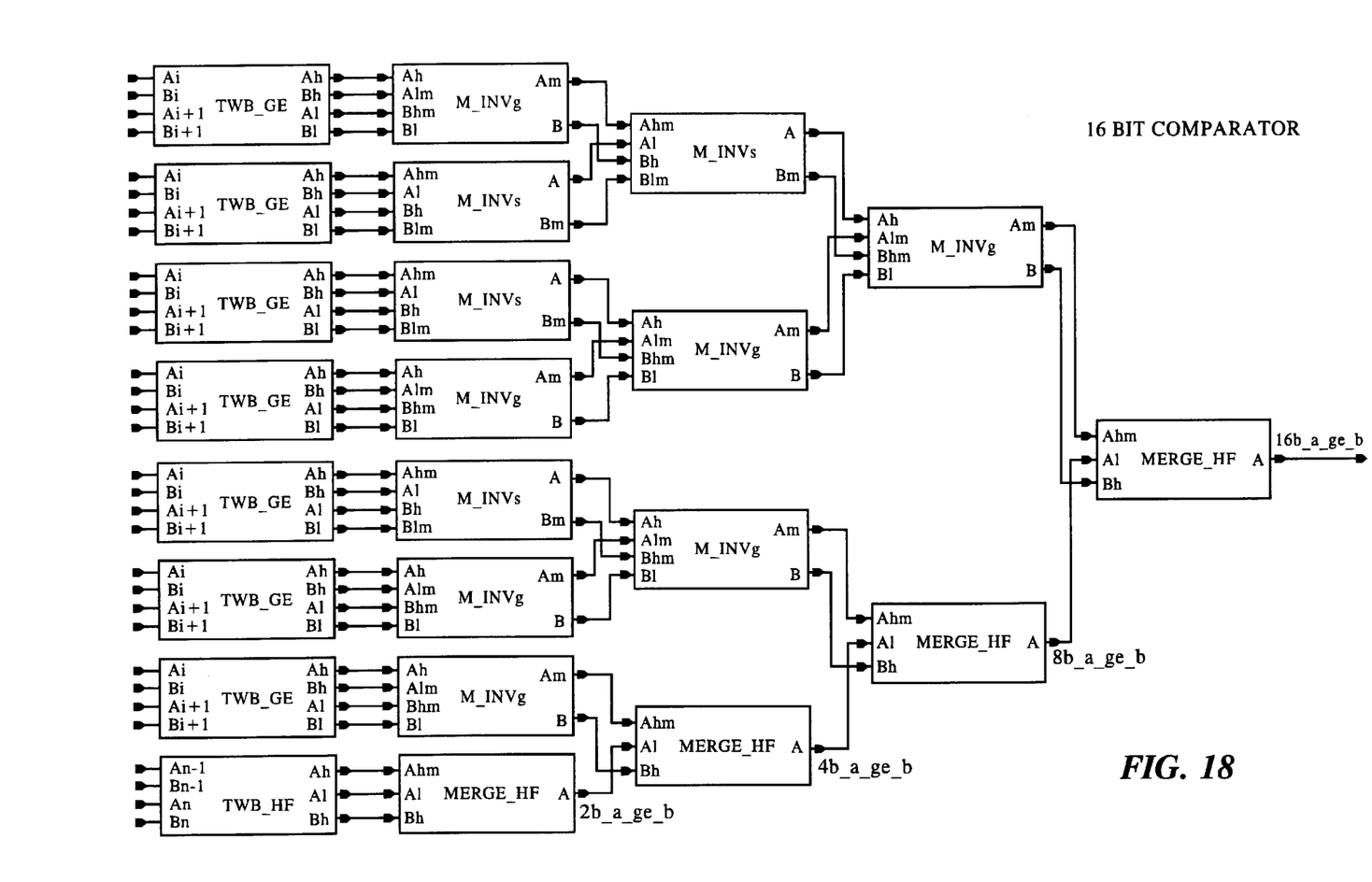
FIG. 18 is a schematic illustration of a 16-bit comparator circuit according to the present invention.

An example of a 16-bit comparator in "flattened" form in accordance with the invention is shown by FIG. 18. The high and low order bits of vectors A and B are received by the seven TWB__GE and the TWB__HF receiving units. The data outputs from the seven TWB__GE units are propagated to the M__INVg and M__INVs merge units. The data outputs from the TWB__HF are propagated to the left-most MERGE__HF merge unit. The data outputs from the M__INVg, M__INVs, and MERGE__HF merge units are propagated to other similar merge units. The final data output relates which whether A>=B or B>=A is provided by the right-most MERGE__HF unit.

It is apparent from FIG. 18 that there are "m" data inputs and outputs. As discussed above, these are the maybe data inputs and outputs which may contain incorrect information. If the information propagated by the "m" data inputs and outputs is incorrect, it is corrected by a succeeding merge unit to provide a correct final output.

Many changes and modifications in the above-described embodiment of the invention can of course, be carried out without departing from the scope thereof. Accordingly, that scope is intended to be limited only by the scope of the appended claims.

What is claimed is:

1. A comparator for performing at least one greater or equal comparison between N-bits of a first binary number, A, and a second binary number, B, and providing one final output based on said comparison, said comparator comprising:

a comparing circuit for comparing a bit pair, one bit from the first binary number and another bit from the second binary number, said comparing circuit having at least two outputs, one of said outputs having a true state representing that the bit of the first binary number is greater than or equal to the bit of the second binary number, and second of said outputs having the true state representing that the bit of the second binary number is greater than or equal to the bit of the first binary number;

a half-comparing circuit for comparing the least significant bit of the first binary number with the least significant bit of the second binary number and outputting a true state if the least significant bit of the first binary number is greater than or equal to the least significant bit of the second binary number;

a merging circuit for merging four input bits into two output bits, two bits of said four input bits representing greater than or equal information on a number of high order bits of the two binary numbers, the other two of said four input bits representing greater than or equal on a number of low order bits of the two binary numbers, the two output bits representing greater than or equal information on bits representing high order and low order bits; and a half-merging circuit for merging three input bits into one output bit, two of said input bits representing greater than or equal information on a number of high order bits of the two binary numbers, one of said input bits representing greater than or equal information on a number of low order bits of the two binary numbers, said output bit representing greater than or equal information on a number of bits representing high order and low order bits.

2. A comparator as in claim 1, wherein said merging circuit is of a first type having one of said output bits with no state and second of said output bits without a true state.

3. A comparator as in claim 2, wherein said two output bits of the merging circuit of the first type feed into a merging circuit of a second type in successive merging circuits of the first and second type for the high order bits.

4. A comparator as in claim 2, wherein said one output bit of the half-merging circuit feeds into a half-merging circuit in successive half-merging circuits for the low order bits.

5. A comparator as in claim 1, wherein said merging circuit is of a second type having second of said output bits with no state and one of said output bits without a true state.

6. A comparator as in claim 1, wherein the comparator comprises of S=2+2ceil(2log(N)) stages, where ceil(2log(N)) is the smallest integer greater or equal to 2log(N) and N is the bit value of the comparator and longest path within said comparator comprises of one inverter and S-1 NAND stages, where said NAND stages in said longest path have a fan-out of one.

7. A comparator circuit as in claim 1, wherein the comparator is comprised of CMOS circuitry.

8. A comparator circuit as in claim 1, wherein the comparator consists of inverters and two-way NAND stages.

9. A method for comparing binary input vector A with binary input vector B each having N bits and providing at least one final output having a true state if binary input vector A is greater or equal than binary input vector B, comprising the steps of:

providing said at least one final output from a first stage;

providing an input to the first stage, said input being the output of a second stage identical with said first stage, said output of the second stage being a greater or equal comparison of the low order bits of binary input vector A to the low order bits of binary input vector B;

providing an input to the second stage, said input being the output of a third stage identical with said first stage;

providing two inputs to the first stage, said two inputs being the outputs of a first type of merging stage and containing greater or equal information indicative of the high order bits of the two binary vectors, said first type of merging stage having four inputs;

providing two inputs to the first type of merging stage which contain greater or equal information indicative of the high order bits from a second type of merging stage;

providing two inputs to the first type of merging stage which contain greater or equal information indicative of the low order bits from a merging stage identical with the first type of merging stage;

providing two inputs to the second stage from a merging stage identical with the first type of merging stage;

providing two inputs to the second type of merging stage which contain greater than or equal to information indicative of the high order bits from a merging stage identical with the first type of merging stage;

providing two inputs to the second type of merging stage which contain greater than or equal to information indicative of the low order bits from a merging stage identical with the second type of merging stage;

providing additional inputs to additional merging stages identical to the first type, second type, and first stage to form a binary tree having 2N−1 inputs; and providing the 2N bits of said binary vectors A and B as inputs to at least one comparing stage and one half-comparing stage, said at least one comparing stage and one half-comparing stage providing outputs which are the inputs to said additional merging stages.

10. A method for comparing binary input vector A with binary input vector B each having four bits and providing at least one final output having a true state if binary input vector A is greater or equal than binary input vector B, comprising the steps of:

providing said at least one final output from a first stage;

providing an input to the first stage, said input being the output of a second stage identical with said first stage, said output of the second stage being a greater or equal comparison of the low order bits of binary input vector A to the low order bits of binary input vector B;

providing three inputs to the second stage, said three inputs being the outputs of a half-comparing stage and containing greater than or equal information indicative of the low order bits of the two binary vectors, said half-comparing stage having four inputs;

providing two inputs to the first stage, said two inputs being the outputs of a merging stage and containing greater or equal information indicative of the high order bits of the two binary vectors, said merging stage having four inputs;

providing four inputs to the merging stage which contain greater or equal information indicative of the high order bits from a comparing stage having four inputs; and providing the four bits of said binary vectors A and B as inputs to the comparing stage and the half-comparing stage, said comparing stage providing four outputs which are the inputs to the merging stage and said half-comparing stage providing three outputs which are the inputs to said second stage.

11. A comparator for performing at least one greater or equal comparison between N-bits of a first binary number, A, and a second binary number, B, and providing one final output based on said comparison, said comparator comprising:

a comparing circuit for comparing a bit pair, one bit from the first binary number and another bit from the second binary number, said comparing circuit having at least two outputs, one of said outputs having a true state representing that the bit of the first binary number is greater than or equal to the bit of the second binary number, and second of said outputs having the true state representing that the bit of the second binary number is greater than or equal to the bit of the first binary number;

a half-comparing circuit for comparing the least significant bit of the first binary number with the least significant bit of the second binary number and outputting a true state if the least significant bit of the first binary number is greater than or equal to the least significant bit of the second binary number;

a merging circuit for merging four input bits into two output bits, two bits of said four input bits representing greater than or equal information on a number of high order bits of the two binary numbers, the other two of said four input bits representing greater than or equal on a number of low order bits of the two binary numbers, the two output bits representing greater than or equal information on bits representing high order and low order bits;

a tap-off circuit for merging two input bits into one bit, each of said two input bits representing greater than or equal, each of said two input bits representing lower order bits of the two binary numbers; and a half-merging circuit for merging three input bits into one output bit, two of said input bits representing greater than or equal information on a number of high order bits of the two binary numbers, one of said input bits representing greater than or equal information on a number of low order bits of the two binary numbers, said output bit representing greater than or equal information on a number of bits representing high order and low order bits.

12. A comparator as in claim 11, wherein the comparator comprises of S=2+2ceil(2log(N)) stages, where ceil(2log(N)) is the smallest integer greater or equal to 2log(N) and N is the bit value of the comparator and longest path within said comparator comprises of one inverter and S-1 NAND stages, where said NAND stages in said longest path have a fan-out of one.

13. A comparator circuit as in claim 11, wherein the comparator is comprised of CMOS circuitry.

14. A comparator circuit as in claim 11, wherein the comparator consists of inverters and two-way NAND stages.

* * * * *